United States Patent
Pust et al.

(10) Patent No.: US 6,364,743 B1
(45) Date of Patent: Apr. 2, 2002

(54) COMPOSITE LAPPING MONITOR RESISTOR

(75) Inventors: Ladislav Rudolf Pust, Savage; Brenda Anne Everitt, Minneapolis, both of MN (US)

(73) Assignee: Seagate Technology LLC, Scotts Valley, CA (US)

(*) Notice: Subject to any disclaimer, the term of this patent is extended or adjusted under 35 U.S.C. 154(b) by 0 days.

(21) Appl. No.: 09/590,572

(22) Filed: Jun. 9, 2000

Related U.S. Application Data (60) Provisional application No. 60/138,703, filed on Jun. 11, 1999.

(51) Int. Cl.[7] .................................................. B24B 7/00
(52) U.S. Cl. .................................. 451/5; 451/8; 451/41; 29/603
(58) Field of Search .............................. 451/1, 5, 8, 57, 451/41; 29/603

(56) References Cited

U.S. PATENT DOCUMENTS

| | | | |
|---|---|---|---|
| 4,670,732 A | 6/1987 | Church | |
| 4,689,877 A * | 9/1987 | Church | 451/1 X |
| 4,841,625 A * | 6/1989 | Valstyn | 451/1 X |
| 4,861,398 A * | 8/1989 | Fukuoka et al. | 451/1 X |
| 4,912,883 A * | 4/1990 | Chang et al. | 451/1 |
| 5,065,483 A | 11/1991 | Zammit | |
| 5,210,667 A | 5/1993 | Zammit | |
| 5,361,547 A * | 11/1994 | Church et al. | 451/5 |
| 5,463,805 A | 11/1995 | Mowry et al. | |
| 5,559,429 A | 9/1996 | Mowry et al. | |
| 5,722,155 A | 3/1998 | Stover et al. | |
| 5,876,264 A * | 3/1999 | Church et al. | 451/5 |
| 5,885,131 A * | 3/1999 | Azarian et al. | 451/5 |
| 5,967,878 A * | 10/1999 | Arcona et al. | 451/5 |
| 6,045,431 A * | 4/2000 | Cheprasov et al. | 451/5 |
| 6,129,613 A * | 10/2000 | Bothra | 451/5 X |
| 6,170,149 B1 * | 1/2001 | Oshiki et al. | 451/5 X |
| 6,196,897 B1 * | 3/2001 | Suto et al. | 451/5 X |

* cited by examiner

Primary Examiner—Joseph J. Hail, III
Assistant Examiner—Anthony Ojini
(74) Attorney, Agent, or Firm—Merchant & Gould P.C.

(57) ABSTRACT

A lapping monitor resistor for thin film transducers that rely upon an insulation layer to define a critical dimension includes a first conductive layer having a plurality of conductive blocks, an insulating layer formed over at least a portion of the first conductive layer, and a second conductive layer having a plurality of conductive blocks. The second conductive layer is electrically connected to the first conductive layer over portions where the insulating layer is not formed. A method of controlling lapping depth involves use of the lapping monitor resistor.

14 Claims, 7 Drawing Sheets

COMPOSITE LAPPING MONITOR RESISTOR

This application claims the benefit of provisional application serial No. 60/138,703, entitled "COMPOSITE ELECTRICAL RESISTIVE SENSOR FOR MONITORING THE LAPPING DEPTH WITH REFERENCE TO THE EDGE OF AN INSULATING LAYER FOR THE V-GMR HEADS," filed Jun. 11, 1999, which is incorporated herein.

TECHNICAL FIELD

The invention relates generally to the manufacture of thin film transducers and relates more specifically to processes for lapping thin film transducers. More specifically, the invention relates to methods of monitoring the lapping depth in a thin film transducer having a critical dimension defined by an insulating layer, as well as to a composite lapping monitor.

BACKGROUND

Rotating disc magnetic recording systems typically employ magnetic head transducers which glide over the magnetic disc media on a cushion of air. The mounting or support structure which carries the transducers are termed "sliders." Sliders have air-bearing surfaces that are propelled off the surface of moving media by boundary air which moves with the media disc. The air-bearing surface of a slider is aerodynamically designed to glide on the boundary air due to a pattern of raised rails and recesses which establish the "fly height" of the slider. Read/write transducers are mounted on the rear side of the slider, with the reader sensor and writer gap at the air-bearing surface, facing the moving media.

A slider assembly typically includes a ceramic slider and associated read/write heads, a support flexure arm, interconnection wires between the heads and external signaling devices, and any associated mounting hardware. The slider assembly is mounted on an arm which is movable over the surface of a rotating magnetic disc to position the slider adjacent selected tracks on the disc. Disc drives usually employ multiple discs which rotate together, spaced apart from one another on a single spindle. One slider assembly is provided for each magnetic recording surface in a disc drive.

In magnetic disc drive data storage devices, digital data are written to and read from a thin layer of magnetizable material on a surface of one or more rotating discs. Write and read operations are performed through write and read transducers. The slider and transducers are sometimes collectively referred to as a head, and typically a single head is associated with each disc surface. When the read transducer is a magnetoresistive (MR) type sensor, the combination of the slider and the transducer are frequently referred to as a MR head. The head is selectively moved under the control of electronic circuitry to any one of a plurality of circular, concentric data tracks on the disc surface by an actuator device. Each slider body includes an air bearing surface (ABS). As the disc rotates, the disc drags air beneath the ABS, which develops a lifting force that causes the head to lift and fly above the disc surface.

It is desirable for the air-bearing surface of a slider to fly as close to the media as possible, without actually physically touching the media. Read/write signal strength and bit resolution are dependent on the spacing between the thin layer of magnetizable material on the surface of the rotating disc and the read/write head. A close spacing between the thin layer of magnetizable material on the surface of the rotating disc and the read/write head substantially improves the transducer's performance. It is also important for the spacing between the slider and media disc to be invariant from the innermost to the outermost diameter data tracks.

Because modern sliders have extremely small fly heights, it is very important that they be accurately machined or lapped. Lapping refers to a process in which a portion of the transducer is ground or otherwise removed in order to achieve a desired dimension within the transducer. The prior art describes lapping methods which utilize resistors that are formed within the thin film transducer to be lapped. Generally, the resistor is positioned such that at least a portion of the resistor will be removed during lapping. As lapping proceeds, part of the resistor is removed, which changes the resistance to electrical flow through the resistor. Once the resistance reaches a predetermined value, lapping can stop as the desired dimension will have been reached.

One known method involves the use of three resistors. Two reference resistors are positioned within a thin film transducer such that they are not effected by a subsequent lapping process. One reference resistor provides a small resistance while the other provides a large resistance. These two resistors are used to calculated the sheet resistance of a composite and from that the target resistance of the third resistor is also calculated. As lapping proceeds, the change of resistance of the third resistor at various places of the lapped wafer, containing a number of transducers, allows adjustment of the lapping rate at different points along the lapped wafer so that the target resistance is reached at the same time for all heads, thereby signaling a stop to the lapping process.

The above-described method generally requires accurate patterning of a conductive strip to function as the lapped resistor and therefore is not feasible for use with transducers relying upon an insulating layer for a critical dimension, such as folded vertical GMR heads. These heads consist of two conducting GMR layers that are partially separated by an insulating layer. For this type of head, the critical distance is the distance between the front edge of the insulating layer and the air bearing surface. Because the critical layer is an insulator, any resistive lapping monitor made from a single conducting layer (as commonly done) would not be accurately aligned with the critical front edge of the insulating layer.

Therefore, there is a need for an accurate way to monitor the lapping depth within transducers in which a critical lapping dimension is defined by an insulating layer, i.e. a folded vertical GMR head.

SUMMARY

According to a first aspect of the present invention, there is provided a method of controlling a lapping depth when processing a wafer to produce a thin film transducer having a first insulating layer and at least one non-insulating layer in which a critical dimension is determined by an edge of the insulating layer. The method includes depositing a first conductive layer having a plurality of individual blocks on the wafer and depositing a second insulating layer over at least a portion of the first conductive layer. The method further includes the steps of depositing a second conductive layer having a plurality of individual blocks on the wafer so that the individual blocks of the second conducting layer are offset in relation to the individual blocks of the first conductive layer.

The second insulating layer has an insulating layer edge defining a first region in which the first conductive layer is electrically disconnected from the second conductive layer and a second region in which the first conductive layer is electrically connected to the second conductive layer, thereby providing a composite lapping monitor resistor made up of first conductive layer, the insulating layer and the second conductive layer.

The method also includes steps of providing an electrical current that conducts through the blocks of the first and second conductive layers, the first and second conductive layers providing a resistance to said electrical current, lapping the wafer while monitoring said resistance to said electrical current and stopping lapping once said resistance reaches a predetermined value.

According to another aspect of the invention, there is provided a lapping monitor resistor for monitoring lapping depth in thin film transducers having a first insulating layer and at least one non-insulating layer wherein a critical dimension is determined by an edge of the insulating layer. The monitor includes a first conductive layer having a plurality of conductive blocks, a second insulating layer formed over at least a portion of the first conductive layer, and a second conductive layer having a plurality of conductive blocks, where the second conductive layer is electrically connected to the first conductive layer where the second insulating layer is not formed.

According to yet another aspect of the invention, there is provided a monitor resistor for monitoring lapping depth in thin film transducers. The resistor includes a first and second conductive layer wherein the first and second conductive layers are electrically uncoupled by an insulating layer in a first region and the first and second conductive layers are electrically coupled in a second region. The resistor also includes means for measuring resistance in the second region as the first and second conductive layers are lapped.

The above, as well as additional objects, features, and advantages of the present invention will become apparent in the following detailed written description.

BRIEF DESCRIPTION OF THE DRAWINGS

For a fuller understanding of the nature and advantages of the present invention, as well as the preferred mode of use, reference should be made to the following detailed description read in conjunction with the accompanying drawings. In the following drawings, like reference numerals designate like or similar parts throughout the drawings.

DETAILED DESCRIPTION OF THE PRESENTLY PREFERRED EMBODIMENTS

The following description is a detailed description of the preferred embodiments presently contemplated for carrying out the present invention. This description is made for the purpose of illustrating the general principles of the present invention and is not meant to limit the inventive concepts claimed herein.

Figure 1:
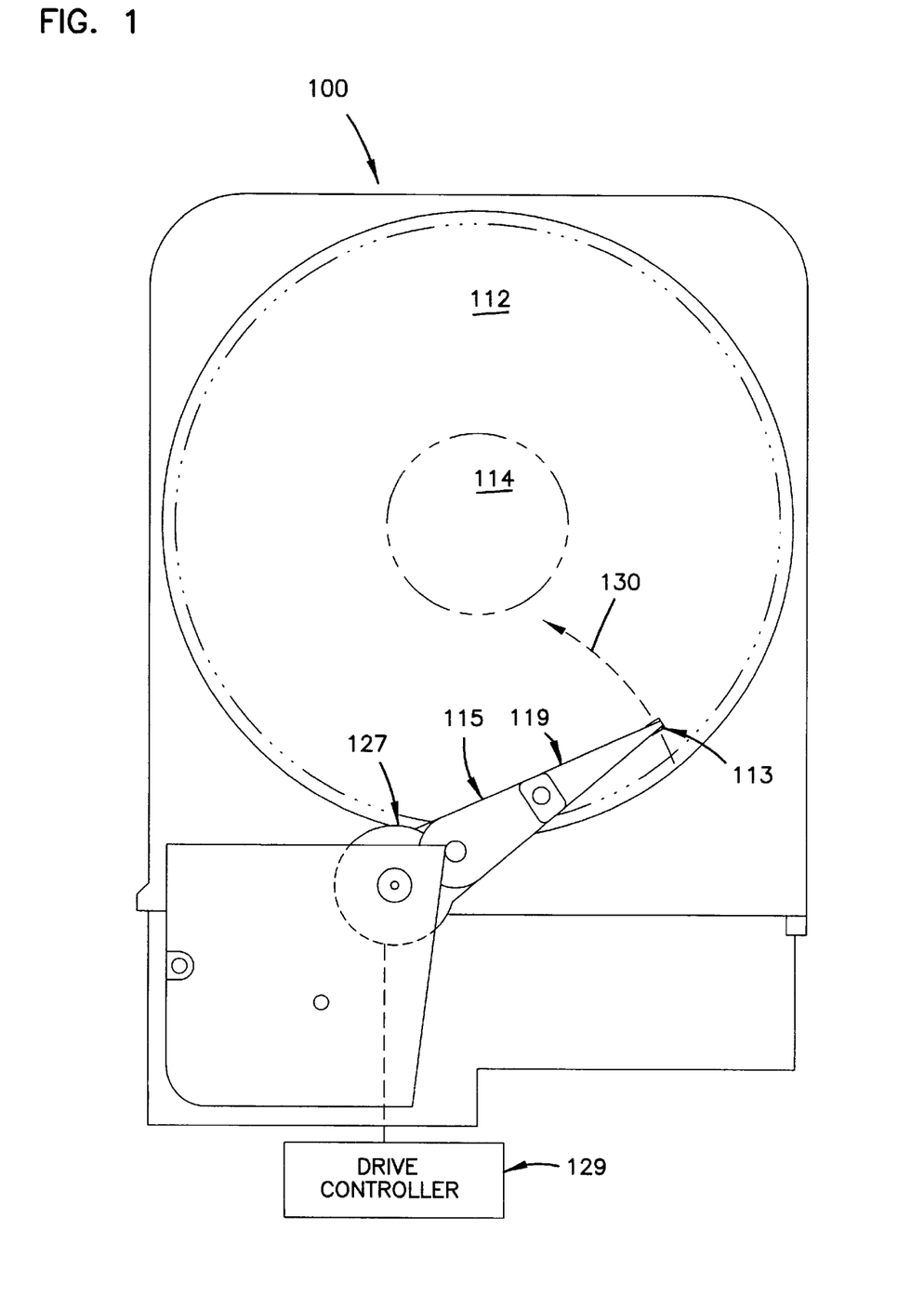
FIG. 1 is a simplified drawing of a magnetic recording disc system.

FIG. 1 shows a disc drive system 100 embodying the present invention. As shown in FIG. 1, at least one rotatable magnetic disc 112 is supported on a spindle 114 and rotated by a disc drive motor. The magnetic recording media on each disc is in the form of an annular pattern of concentric data tracks (not shown) on disc 112.

At least one slider 113 is positioned on the disc 112, each slider 113 supporting one or more magnetic read/write heads incorporating the present invention. As the discs rotate, slider 113 is moved radially in and out as shown by arrow 130 over the disc surface so that the heads located on the slider 113 may access different portions of the disc where desired data is either recorded or to be written. Each slider 113 is attached to an actuator arm 119 by a suspension 115. The suspension 115 provides a slight spring force which biases the slider 113 against the disc surface. Each actuator arm 119 is attached to an actuator 127.

During operation of the disc storage system, the rotation of disc 112 generates an air bearing between an air bearing surface (ABS) on the slider 113 and the disc 112. The ABS is the surface of slider 113 which faces the surface of disc and the disc surface. The air bearing exerts an upward force or lift on the slider 113. The air bearing thus counterbalances the slight spring force of suspension 115 and supports the slider 113 slightly above the disc 112 surface by a small, substantially constant spacing during normal operation.

The various components of the disc storage system are controlled in operation by control signals generated by control unit 129, such as access control signals and internal clock signals. Typically, control unit 129 includes logic control circuits, storage and a microprocessor. The control unit generates control signals to control various system operations such as drive motor control signals and head position and seek control signals. The control signals provide the desired current profiles to optimally move and position slider 113 to the desired data track on disc 112.

The above description of a typical magnetic disc storage system, and the accompanying illustration of FIG. 1 are for representation purposes only. It should be apparent that disc storage systems may contain a large number of discs and actuators, and each actuator may support a number of sliders.

Figure 2:
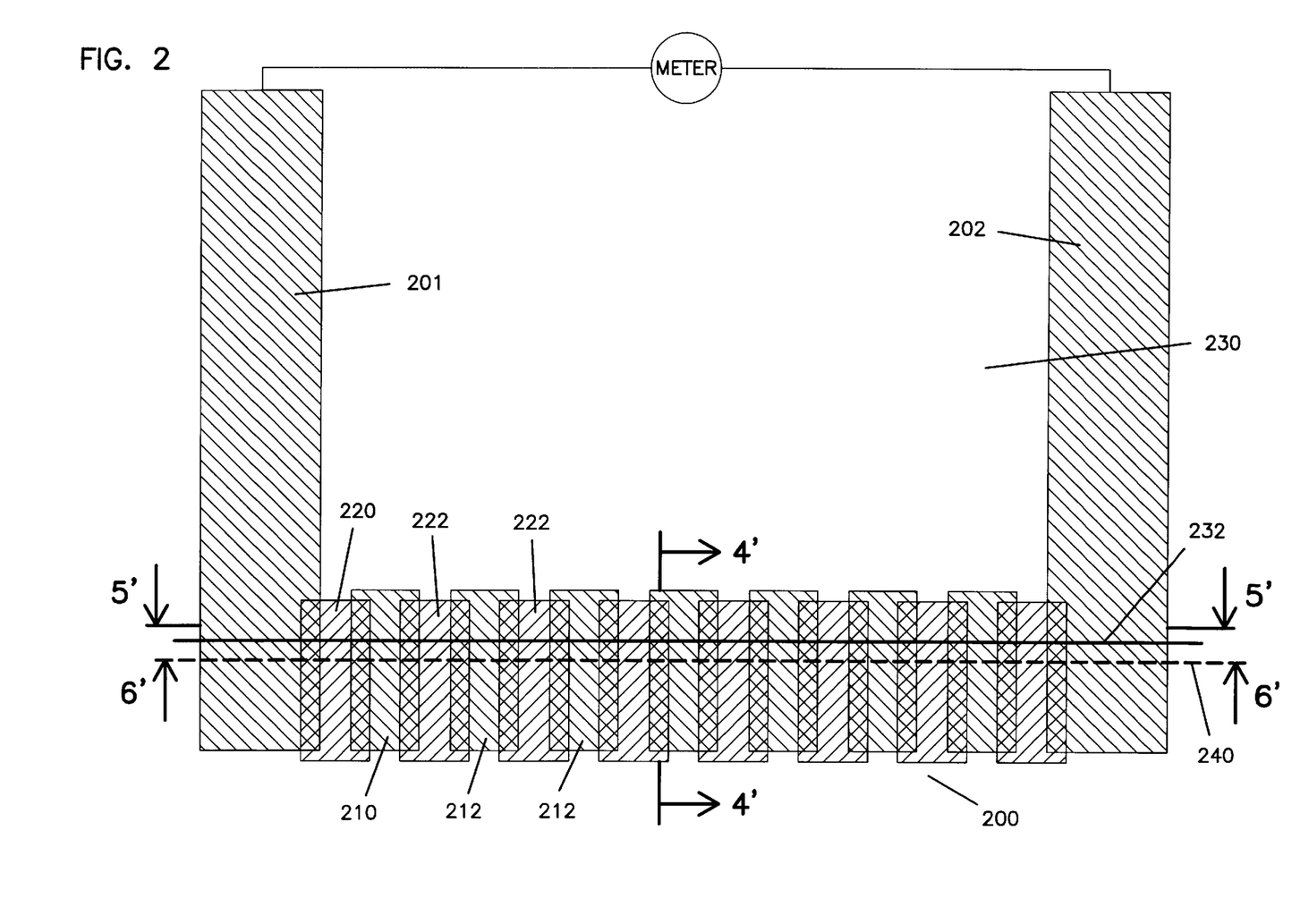
FIG. 2 is a top plan view of a composite lapping monitor resistor on one side of a thin film transducer according to a preferred embodiment of the invention.

FIG. 2 is a top plan view of a lapping monitor resistor 200 on one side of a thin film transucer according to a preferred embodiment of the present invention, while FIGS. 3 through 6 are various cross-sectional views of the lapping monitor resistor 200, as will be described in conjunction with FIG. 2. Preferably, the lapping monitor resistor 200 has a first conducting layer 210 that is made up of a number of individual blocks 212. An insulating layer 230 is formed over at least a portion of the first conducting layer 210 with a front edge 232 recessed with respect to a target lapping level 240. A second conducting layer 220 that is made up of a number of individual blocks 222 is disposed atop the first conducting layer 210, separated at least partially by the insulating layer 230.

Figure 5:
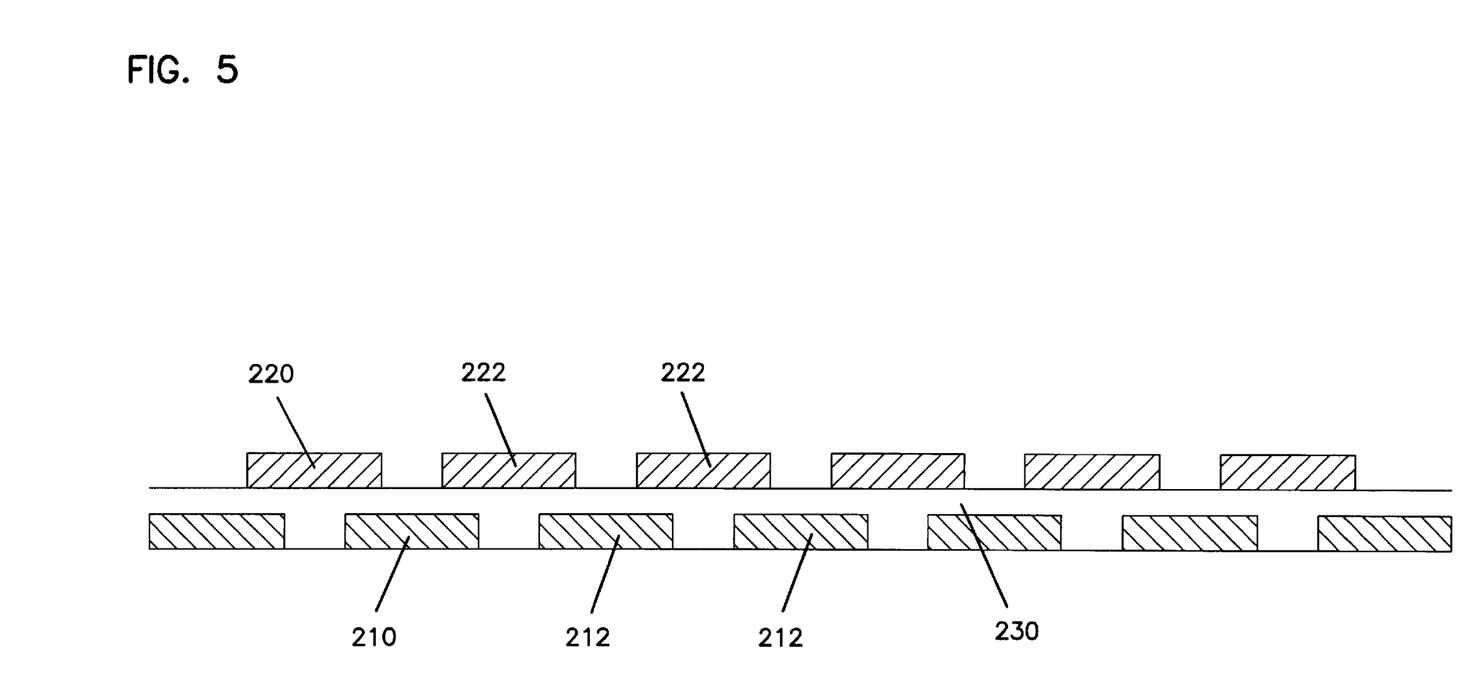
FIG. 5 is a cross-sectional view of the composite lapping monitor resistor shown in FIG. 2, taken along the 5'—5' line.
Figure 6:
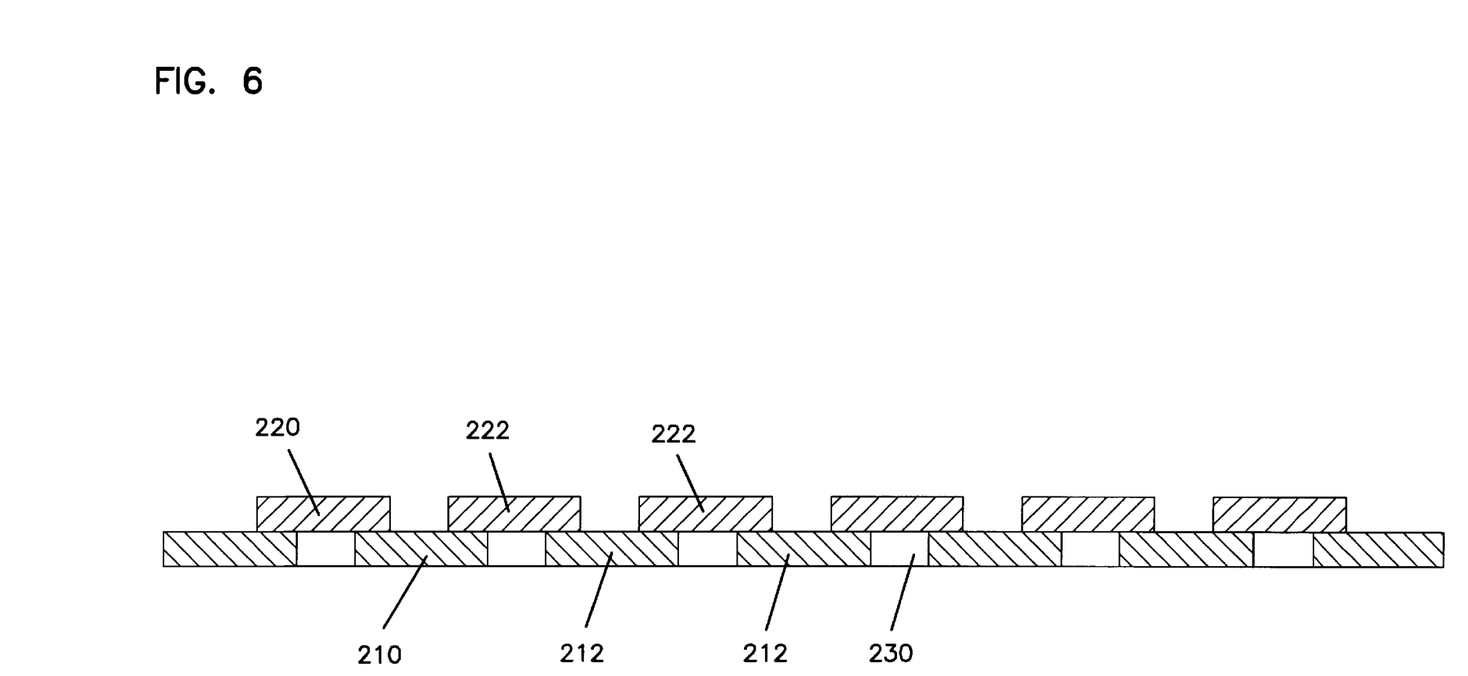
FIG. 6 is a cross-sectional view of the composite lapping monitor resistor shown in FIG. 2, taken along the, 6'—6' line.

Each of two electric leads 201, 202, which are made at least partly of either first conducting layer 210, second conducting layer 220 or a combination thereof, carries current to the resistor 200. The individual blocks 212, 222 of the first and second conductive layers 210, 220, respectively, are electrically connected only where the insulating layer 230 is not present, i.e. under the front edge 232 of the insulating layer 230 (as seen in FIG. 6). Conversely, blocks 212, 222 are not in electrical contact above the front edge 232, as illustrated in FIG. 5). The individual blocks 212, 222 may or may not be aligned along front and back edges, as seen in FIG. 2.

Figure 3:
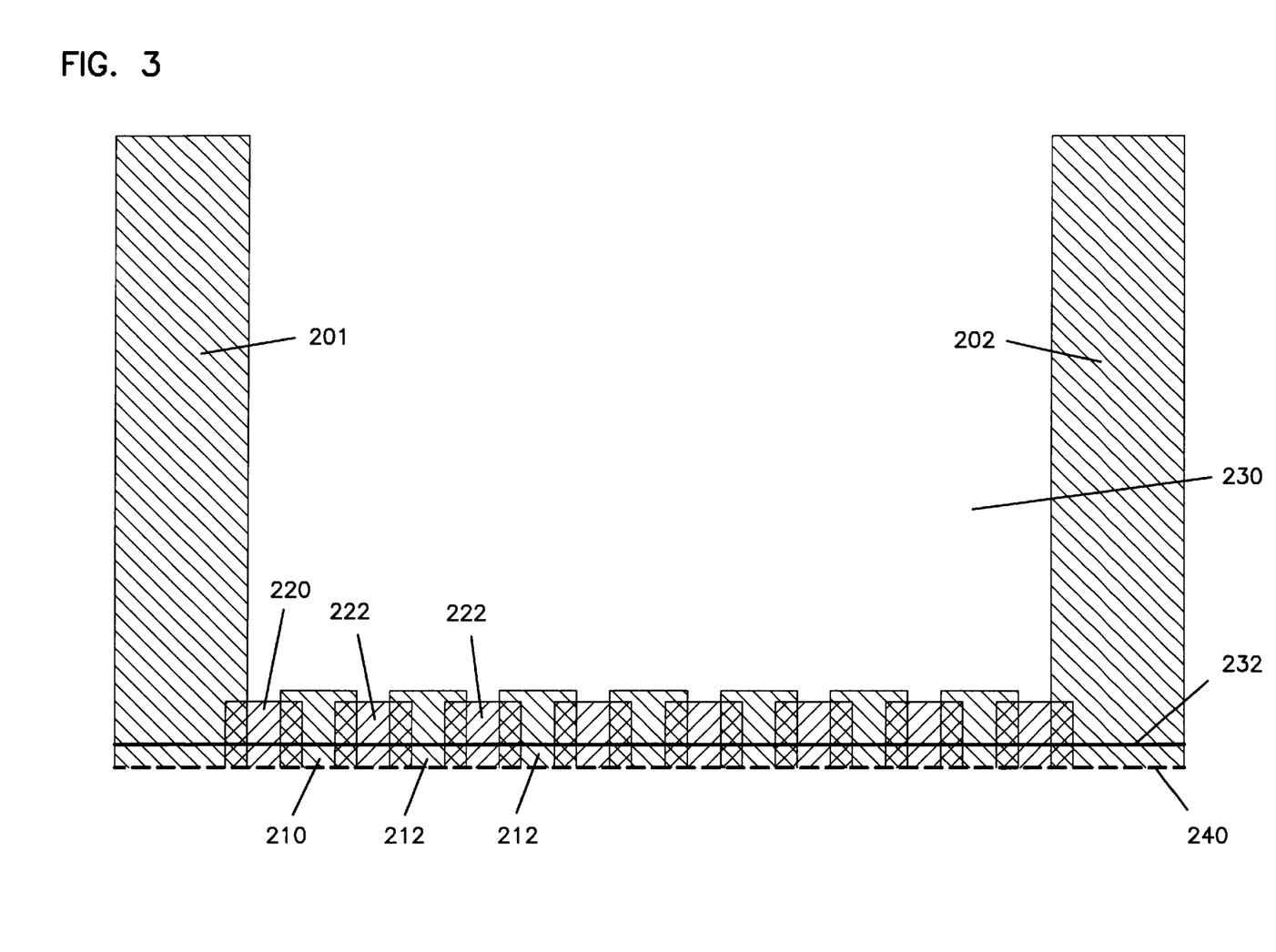
FIG. 3 is a top plan view of the composite lapping monitor resistor illustrated in FIG. 2, shown here after a lapping process has been completed.

FIG. 3 is a top plan view showing the lapping monitor 200 of FIG. 2 after lapping is completed. After reaching the target lapping level 240, the blocks 212, 222 are electrically connected only between the target lapping level 240 and the front edge 232 of the insulating layer 230. If lapping were to continue further, the blocks 212, 222 would become electrically disconnected when lapping reaches the front edge 232.

Figure 4:
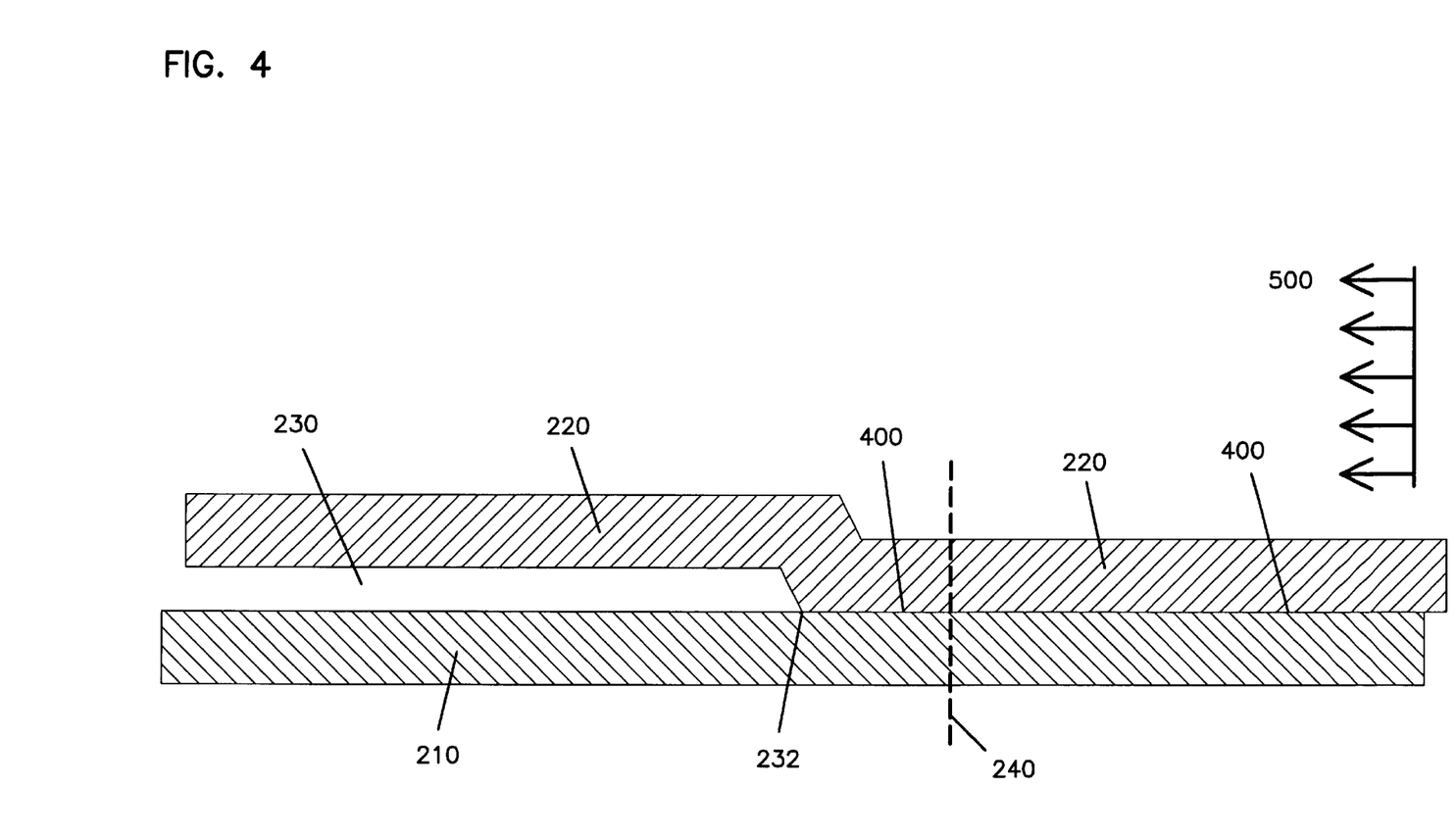
FIG. 4 is a cross-sectional view of the composite lapping monitor resistor shown in FIG. 2, taken along the 4'—4' line.

FIG. 4, which is a cross-sectional view taken along the 4'—4' line of FIG. 2, illustrates a preferred geometric relationship between the first conducting layer 210 and the second conducting layer 220. As illustrated, the insulating layer 230 has been deposited over at least a portion of the first conducting layer 210. The second conducting layer 220 is then preferably deposited over both the insulating layer 230 and the first conducting layer 210. Preferably, the first conducting layer 210 and the second conducting layer 220 are electrically connected in a region 400. The conducting layers 210 and 220 are preferably electrically disconnected by the insulating layer 230 beyond the region 400. The front edge 232 of the insulating layer 230 forms the boundary between regions in which the conductive blocks 212, 222 are electrically connected and regions in which the conductive blocks 212, 222 are electrically disconnected.

The insulating layer 230 has an insulating layer edge 232 that defines a reference lapping level. In a preferred embodiment, the insulating layer edge 232 is just above the electrically disconnected blocks 212 making up the first conducting layer 210. As shown in FIGS. 5 and 6, the individual first conducting layer blocks 212 and the second conducting layer blocks 222 are electrically disconnected above the insulating layer edge 232 where the insulating layer 230 separates the two but are electrically connected below the insulating layer edge 232 where there is no insulating layer therebetween.

A test electrical current flows through the lapping monitor resistor 200 in such a way that it alternates between the first conducting layer 210 and the second conducting layer 220, but the current can only pass back and forth between the first conducting layer 210 and the second conducting layer 220 in regions 400 (see FIG. 4) where the insulating layer 230 is not present, i.e. below the insulating layer edge 232. Thus, the resistance of this structure depends on the width of the structure not covered by the insulating layer 230. During lapping, the structure width decreases and the resistance increases. The changing resistance provides important information regarding the distance between the insulating layer edge 232 and the present lapping level. Preferably, lapping ceases prior to reaching the front edge 232 of the insulating layer 230. While at least a portion of the lapping resistor 200 remains below the front edge 232, the lapping depth is readily determined as a function of the measured resistance. Once the entire resistor 200 is removed below the front edge 232, however, current flow goes to zero and there is no way to readily determine present lapping depth in relation to a desired lapping depth. Lapping occurs in the direction 500 as indicated.

As is well known in the art, thin film transducers are formed by depositing and etching the appropriate conducting and insulating layers over a large wafer which is eventually sliced into wafer slices and ultimately diced to separate the wafer slices into individual transducers. In a preferred embodiment, the first conducting layer 210, the insulating layer 230 and second conducting layer 220 are deposited on a wafer at the same time as the corresponding layers are deposited on the wafer to ultimately form a thin film transducer.

An important advantage to simultaneously depositing the transducer layers and the monitor resistor layers is that any processing variations effect both equally. Thus, if, for example, the second conducting layer of the transducer is slightly out of position or size, the corresponding second conducting layer 220 of the lapping monitor resistor 200 will also be slightly out of position or size. By using the lapping monitor 200 to control lapping, any variations in layer deposition are accounted for.

Figure 7:
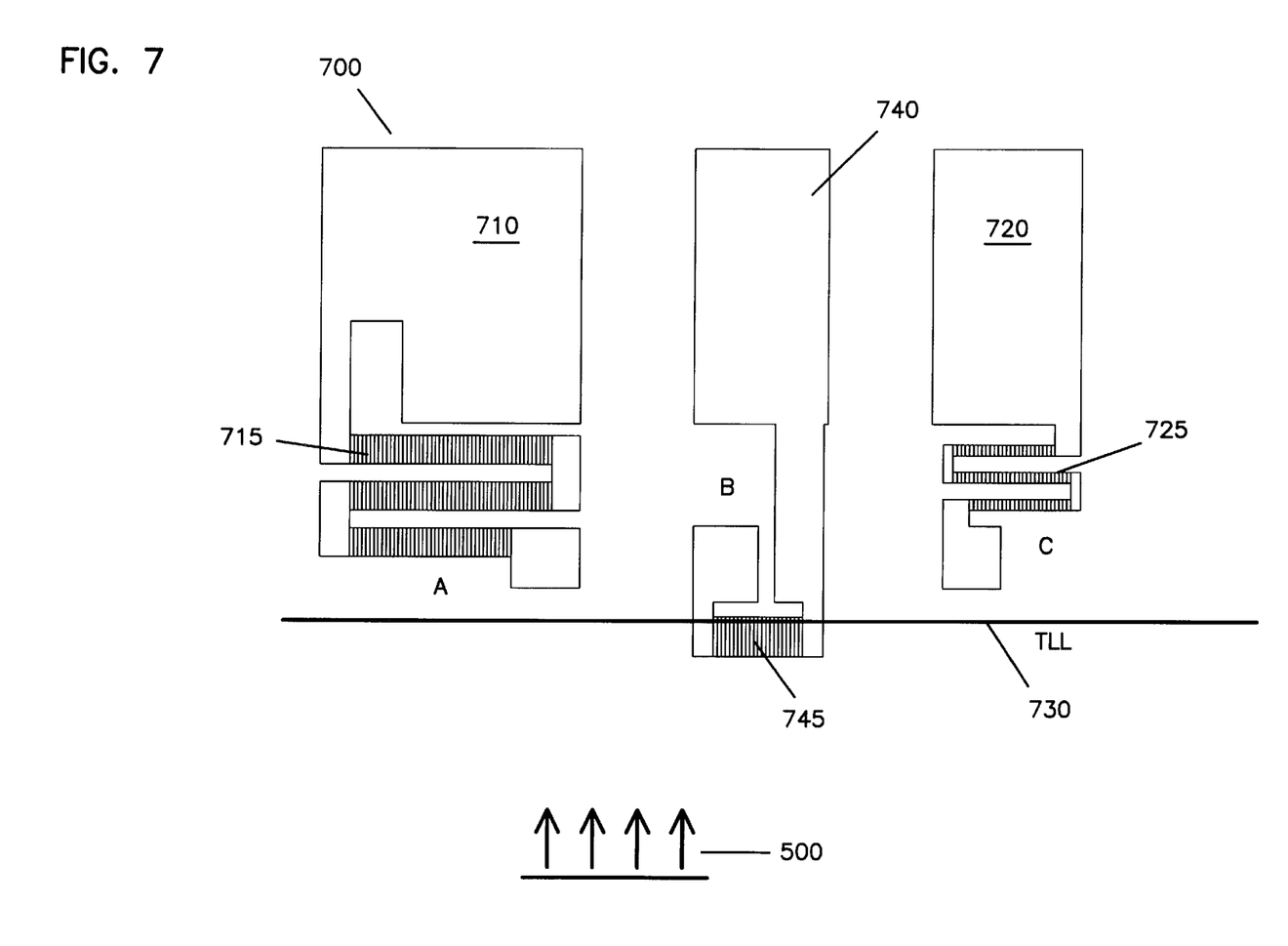
FIG. 7 is a top plan view of a lapping sensor, illustrating placement of the composite lapping monitor resistor of FIG. 2 and two reference composite resistors in relation to two adjacent transducers on a wafer strip.

FIG. 7 is a top plan view of a lapping sensor 700 that has three resistors 710, 740 and 720 having resistive portions 715, 745 and 725, respectively. Each resistive portion 715, 745, 725 is formed from a composite structure having blocks made from the first and second conductive layers 210, 220 (see FIG. 2). Resistors 710, 720 are positioned such that they are not affected by a subsequent lapping process. Resistor 740, however, is partially removed during lapping. The lapping occurs in the direction 500 as indicated.

As illustrated, resistor 710 includes a composite reference resistive portion 715 and resistor 720 has a composite reference resistive portion 725. In a preferred embodiment, composite reference resistors 710 and 720 are prepared in the same manner as the aforementioned lapping monitor resistor 200. Preferably, all three composite resistors 710, 720 and 740 are deposited simultaneously, as previously described. The composite reference resistors 710 and 720 are used to provide low and high resistance values, respectively. In the embodiment shown in FIG. 7, the resistive portions 715 and 725 each consist of three individual resistors that are electrically connected in series. Alternatively, each resistive portion 715 and 725 could each have more or fewer than three individual resistors.

During lapping, the resistive portion 745 of composite resistor 740 becomes increasingly narrower, thereby increasing its resistance to electrical flow. Once the composite resistor 740 provides an electrical resistance that is within a required range, the lapping process stops.

In summary, a method of controlling a lapping depth when processing a wafer comprising a first insulating layer and at least one non-insulating layer to produce a thin filn transducer in which a critical dimension is determined by an edge of the insulating layer is provided. The method includes depositing a first conductive layer 210 having a plurality of individual blocks 212 on the wafer and depositing a second insulating layer 230 covering a portion of the first conductive layer 210. The method further includes the steps of depositing a second conductive layer 220 having a plurality of individual blocks 222 on the wafer so that the individual blocks 222 of the second conducting layer 220 are offset in relation to the individual blocks 212 of the first conductive layer 210.

The second insulating layer 230 comprises an insulating layer edge 232 defining a first region in which the first conductive layer 210 is electrically disconnected from the second conductive layer 220 and a second region 400 in which the first conductive layer 210 is electrically connected to the second conductive layer 220, thereby providing a composite lapping monitor resistor 200, 745 comprising the first conductive layer 210, the second insulating layer 230 and the second conductive layer 210.

The method also includes steps of providing an electrical current that conducts through the blocks 212, 222 of the first and second conductive layers 210, 220, the first and second conductive layers 210, 220 providing a resistance to said electrical current, lapping the wafer while monitoring said resistance to said electrical current and stopping lapping once said resistance reaches a predetermined value. Preferably, the predetermined value is fixed or calculated based on one or more composite reference resistors 715, 725 which are deposited concurrently with the composite resistor 745.

A lapping monitor resistor 200, 745 for thin film transducers having a first insulating layer and at least one non-insulating layer wherein a critical dimension is determined by an edge of the insulating layer is provided. The resistor 200, 740 includes a first conductive layer 210 having a plurality of conductive blocks 212, a second insulating layer 230 formed over at least a portion of the first conductive layer 210, and a second conductive layer 220 having a plurality of conductive blocks 222, where the second conductive layer 220 is electrically connected to the first conductive layer 210 where the second insulating layer 230 is not formed.

Preferably, the second insulating layer 230 has an insulating layer edge 232 that determines lapping depth, where the first conductive layer 210 and the second conductive layer 220 are electrically disconnected above the insulating layer edge 232 and are electrically connected below the insulating layer edge 232. In a preferred embodiment, a test electrical current alternates from the first conductive layer 210 to the second conductive layer 220 only in portions where the insulating layer 230 is not formed. Preferably, the lapping monitor 200, 745 has a conductance that decreases nearly linearly as a lapping depth approaches the insulating layer edge 232.

In a preferred embodiment, a lapping sensor 700 includes a lapping monitor resistor 200, 740 as described herein. Preferably, the lapping sensor 700 also includes a first reference resistor 710 that provides a low resistance and a second reference resistor 720 that provides a large resistance.

A monitor resistor 200, 740 for monitoring lapping depth in thin film transducers is provided. The resistor 200, 740 includes a first and second conductive layer 210, 220 wherein the first and second conductive layers 210, 220 are electrically uncoupled by an insulating layer 230 in a first region and the first and second conductive layers are electrically coupled in a second region 400. The resistor 200, 740 also includes means for measuring resistance in the second region 400 as the first and second conductive layers 210, 220 are lapped.

Preferably, the insulating layer 230 has an edge 232 that determines lapping depth. The resistor 200 preferably has a conductance that decreases nearly linearly as a lapping depth approaches the insulating layer edge 232. In a preferred embodiment, the means for measuring resistance includes an electrical current applied to the first conductive layer 210 and a meter for measuring resistance of the resistor 200.

The above specification, examples and data provide a complete description of the manufacture and use of the composition of the invention. Since many embodiments of the invention can be made without departing from the spirit and scope of the invention, the invention resides in the claims hereinafter appended.

What is claimed is:

1. A method of controlling a lapping depth when processing a wafer to produce a thin film transducer comprising a first insulating layer and at least one non-insulating layer in which a critical dimension is determined by an edge of the first insulating layer, the method comprising steps of:
   (a) forming a first composite resistor comprising steps of:
      (1) depositing a first conductive layer comprising a plurality of individual blocks on the wafer;
      (2) depositing a second insulating layer covering a portion of the first conductive layer;
      (3) depositing a second conductive layer comprising a plurality of individual blocks on the wafer so that the individual blocks of the second conducting layer are offset in relation to the individual blocks of the first conductive layer, where the second insulating layer comprises an insulating layer edge defining a first region in which the first conductive layer is electrically disconnected from the second conductive layer and a second region in which the first conductive layer is electrically connected to the second conductive layer, thereby providing a composite lapping monitor resistor comprising the first conductive layer, the second insulating layer and the second conductive layer;
   (b) providing an electrical current that conducts through the blocks of the first and second conductive layers, the first and second conductive layers providing a resistance to said electrical current;
   (c) lapping the wafer while monitoring said resistance to said electrical current; and
   (d) stopping lapping once said resistance reaches a predetermined value.

2. The method of claim 1 wherein the predetermined value is a fixed value.

3. The method of claim 1 further comprising a step of forming an additional composite resistor concurrently with the first composite resistor wherein the predetermined value is calculated using the additional composite resistor.

4. A monitor resistor for monitoring lapping depth in thin film transducers that comprise a first insulating layer and at least one non-insulating layer wherein a critical dimension is determined by an edge of the first insulating layer, the lapping monitor resistor comprising:
   a first conductive layer comprising a plurality of conductive blocks;
   a second insulating layer formed over at least a portion of the first conductive layer; and
   a second conductive layer comprising a plurality of conductive blocks, wherein the conductive blocks of the second conductive layer are offset in relation to the conductive blocks of the first conductive layer and wherein the second insulating layer comprises an insulating layer edge defining a first region in which the first conductive layer is electrically disconnected from the second conductive layer and a second region in which the first conductive layer is electrically connected to the second conductive layer;
   the second conductive layer electrically connected to the first conductive layer where the second insulating layer is not formed.

5. The monitor of claim 4 wherein the second insulating layer comprises an insulating layer edge that determines lapping depth.

6. The monitor of claim 5 having a conductance that decreases nearly linearly as a lapping depth approaches the insulating layer edge.

7. The monitor of claim 5 wherein the first conductive layer and the second conductive layer are electrically disconnected above the insulating layer edge and the first conductive layer and the second conductive layer are electrically connected below the insulating layer edge.

8. A monitor resistor for monitoring lapping depth in thin film transducers that comprise a first insulating layer and at least one non-insulating layer wherein a critical dimension is determined by an edge of the first insulating layer, the lapping monitor resistor comprising:

a first conductive layer comprising a plurality of conductive blocks;

a second insulating layer formed over at least a portion of the first conductive layer;

a second conductive layer comprising a plurality of conductive blocks, the second conductive layer electrically connected to the first conductive layer where the second insulating layer is not formed;

wherein the second insulating layer comprises an insulating layer edge that determines lapping depth;

wherein the first conductive layer and the second conductive layer are electrically disconnected above the insulating layer edge and the first conductive layer and the second conductive layer are electrically connected below the insulating layer edge; and wherein a test electrical current alternates from first conductive layer to second conductive layer only in portions where the second insulating layer is not formed.

9. A monitor resistor for monitoring lapping depth in thin film transducers that comprise a first insulating layer and at least one non-insulating layer wherein a critical dimension is determined by an edge of the first insulating layer, the lapping monitor resistor comprising:

a first conductive layer comprising a plurality of conductive blocks;

a second insulating layer formed over at least a portion of the first conductive layer; and a second conductive layer comprising a plurality of conductive blocks, the second conductive layer electrically connected to the first conductive layer where the second insulating layer is not formed.

further comprising a first reference resistor that provides a reference low resistance.

10. The lapping sensor of claim 9 further comprising a second reference resistor that provides a reference high resistance.

11. A monitor resistor for monitoring lapping depth in thin film transducers, the resistor comprising:

a first and second conductive layer wherein the first and second conductive layers are electrically uncoupled by an insulating layer in a first region and the first and second conductive layers are electrically coupled in a second region; and means for measuring resistance in the second region as the first and second conductive layers are lapped, wherein the conductive blocks of the second conductive layer are offset in relation to the conductive blocks of the first conductive layer.

12. The monitor resistor of claim 11 wherein the insulating layer has an edge that determines lapping depth.

13. The monitor resistor of claim 12 wherein having a conductance that decreases nearly linearly as a lapping depth approaches the insulating layer edge.

14. The monitor resistor of claim 11 wherein the means for measuring resistance includes an electrical current applied to the first conductive layer and a meter for measuring resistance of the resistor.

* * * * *

UNITED STATES PATENT AND TRADEMARK OFFICE
CERTIFICATE OF CORRECTION

PATENT NO. : 6,364,743 B1
DATED : April 2, 2002
INVENTOR(S) : Pust et al.

It is certified that error appears in the above-identified patent and that said Letters Patent is hereby corrected as shown below:

<u>Column 2,</u>
Line 24, after "composite" insert -- wafer --.

Signed and Sealed this

Eighth Day of October, 2002

*Attest:*

*Attesting Officer*

JAMES E. ROGAN
*Director of the United States Patent and Trademark Office*